(12) United States Patent
Wirth et al.

(10) Patent No.: US 11,415,230 B2
(45) Date of Patent: Aug. 16, 2022

(54) SLIT VALVE PNEUMATIC CONTROL

(71) Applicant: APPLIED MATERIALS, INC., Santa Clara, CA (US)

(72) Inventors: Paul Z. Wirth, Kalispell, MT (US); Ofer Amir, Half Moon Bay, CA (US); Michael C. Kuchar, Georgetown, TX (US)

(73) Assignee: Applied Material, Inc., Santa Clara, CA (US)

( * ) Notice: Subject to any disclaimer, the term of this patent is extended or adjusted under 35 U.S.C. 154(b) by 127 days.

(21) Appl. No.: 16/836,231

(22) Filed: Mar. 31, 2020

(65) Prior Publication Data
US 2021/0301929 A1    Sep. 30, 2021

(51) Int. Cl.
| | |
|---|---|
| F16K 3/18 | (2006.01) |
| F16K 3/02 | (2006.01) |
| F16K 31/124 | (2006.01) |
| F16K 37/00 | (2006.01) |
| F15B 21/02 | (2006.01) |
| H01L 21/677 | (2006.01) |
| H01L 21/67 | (2006.01) |

(52) U.S. Cl.
CPC ............ *F16K 3/188* (2013.01); *F16K 3/0254* (2013.01); *F16K 31/124* (2013.01); *F16K 37/0041* (2013.01); *F15B 21/02* (2013.01); *H01L 21/67017* (2013.01); *H01L 21/67739* (2013.01); *H01L 21/67772* (2013.01)

(58) Field of Classification Search
CPC .. F16K 31/1245; F16K 31/122; F16K 3/0254; F16K 31/124; F16K 37/0041; F16K 3/188; H01L 21/67772; H01L 21/67739
See application file for complete search history.

(56) References Cited

U.S. PATENT DOCUMENTS

| | | |
|---|---|---|
| 4,878,417 A | 11/1989 | Facon |
| 5,458,047 A | 10/1995 | McCormick |
| (Continued) | | |

FOREIGN PATENT DOCUMENTS

| | | |
|---|---|---|
| JP | 2014066278 A | 4/2014 |
| JP | 2018010986 A | 1/2018 |
| (Continued) | | |

OTHER PUBLICATIONS

International Search Report and Written Opinion of International Application No. PCT/US2021/025002 dated Jul. 20, 2021, 11 pages.

*Primary Examiner* — Atif H Chaudry
(74) *Attorney, Agent, or Firm* — Lowenstein Sandler LLP

(57) ABSTRACT

Disclosed are a slit valve apparatus and a method for controlling a slit valve. The slit valve apparatus includes a slit valve assembly and a servo-control system in communication with the slit valve assembly. The slit valve assembly includes at least one gate able to transition between an open position and a closed position, at least one pneumatic actuator, at least one proportional pneumatic valve including a plurality of controllers, and a continuous position sensor. The servo-control system includes a centralized controller that generates a control signal and adjusts the movement of the at least one gate based on the position trajectory for the gate, a linear position measurement of the gate from the continuous position sensor, and fluid pressure/flow measurements from the plurality of controllers.

20 Claims, 5 Drawing Sheets

(56) References Cited

U.S. PATENT DOCUMENTS

| | | | |
|---|---|---|---|
| 5,612,850 | A | 3/1997 | Birang |
| 5,684,669 | A | 11/1997 | Collins |
| 5,790,365 | A | 8/1998 | Shel |
| 5,838,528 | A | 11/1998 | Os |
| 6,056,266 | A * | 5/2000 | Blecha ................. F16K 31/122 251/193 |
| 6,523,451 | B1 | 2/2003 | Liao et al. |
| 6,646,857 | B2 | 11/2003 | Anderson et al. |
| 8,434,511 | B2 * | 5/2013 | Williams ................. F16K 3/06 137/340 |
| 8,840,754 | B2 | 9/2014 | Hao |
| 2002/0092569 | A1 | 7/2002 | Maung |
| 2005/0182525 | A1 * | 8/2005 | Laverdiere ........... G05D 7/0635 700/282 |
| 2008/0069669 | A1 * | 3/2008 | Kondoh ............ H01L 21/67196 414/217.1 |
| 2009/0090883 | A1 * | 4/2009 | Lee ................... H01L 21/67126 251/193 |
| 2012/0247564 | A1 | 10/2012 | Kho |
| 2013/0330154 | A1 | 12/2013 | Sowden et al. |
| 2017/0032997 | A1 | 2/2017 | Willwerth et al. |
| 2018/0259075 | A1 | 9/2018 | Hofer et al. |
| 2019/0010967 | A1 * | 1/2019 | Ueda ....................... F15B 15/14 |
| 2019/0030714 | A1 | 1/2019 | Knopf et al. |
| 2020/0166154 | A1 * | 5/2020 | Eschenmoser .......... F16K 3/188 |
| 2020/0182375 | A1 * | 6/2020 | Bohm ....................... F16K 3/10 |
| 2021/0183664 | A1 * | 6/2021 | Loehnert ........... H01L 21/67017 |

FOREIGN PATENT DOCUMENTS

| | | |
|---|---|---|
| KR | 100448377 B1 | 9/2004 |
| KR | 101014651 B1 | 2/2011 |
| KR | 20130067051 A | 6/2013 |
| WO | 9422776 A1 | 10/1994 |

\* cited by examiner

SLIT VALVE PNEUMATIC CONTROL

FIELD OF THE DISCLOSURE

Embodiments of the present disclosure relate generally to the field of electronic device processing systems and methods for servo control of a slit valve apparatus.

BACKGROUND OF THE DISCLOSURE

Semiconductor substrates are commonly processed in vacuum processing systems. These systems include one or more chambers, each performing substrate processing operations such as etching, chemical vapor deposition or physical vapor deposition, which can include heating or cooling of the substrate, and a plasma to assist the process. Typically, the environment within such processing chambers is maintained at a low sub-atmospheric pressure. Each chamber includes inlets and outlets for an evacuation apparatus and the admission of processing gases, as well as an aperture controlled by a slit valve to admit substrates. Such processing chambers may be in communication with a substrate transfer chamber, and the substrate transfer chamber may also have a valve-controlled aperture through which substrates can be admitted from outside the system.

The slit valves that open and close the apertures are typically housed within ports that are positioned between adjacent chambers. The ports typically house at least one gate that is coupled to an actuator used to manipulate it. The actuators can be pneumatic actuators that include one or more pistons for moving the gate from an open position (where the gate is not isolating one chamber from the adjacent chamber and the aperture is open) to a closed position (where the gate is isolating one chamber from the adjacent chamber and the aperture is closed) and vice versa.

Conventional pneumatic slit valve control methodologies include a pneumatic switch, controlled by a system controller, that provides for a full stroke actuation (i.e., two positions—open position or closed position). Additionally, conventional pneumatic slit valve control methodologies include two discrete sensors located at the end positions of the gate (i.e., one at the closed position and one at the open position).

With such conventional pneumatic valve control methodologies, there is no knowledge as to the whereabouts of the gate during its motion from one end position to the other end position. Additionally, upon actuation of the gate to move it from one end position to another, the gate begins accelerating until reaching a steady speed, where it hits a hard stop at its highest velocity. This may contribute to undesirable vibrations and particle generation and wafer defects.

SUMMARY OF THE DISCLOSURE

In certain embodiments, the instant disclosure is directed to a slit valve apparatus for controlling a slit valve. The slit valve apparatus includes a slit valve assembly and a servo-control system in communication with the slit valve assembly. The slit valve assembly includes at least one gate configured to transition between an open position and a closed position. The slit valve assembly further includes at least one pneumatic actuator including at least one moving member coupled to the at least one gate. The slit valve assembly further includes at least one proportional pneumatic valve configured to control fluid pressure and/or fluid flow between a pressurized fluid supply or a vent and the at least one pneumatic actuator. The at least one proportional pneumatic valve includes a plurality of controllers each configured to independently measure and/or control fluid pressure and/or fluid flow in a respective supply line to the at least one pneumatic actuator. The slit valve assembly further includes a continuous position sensor configured to continuously determine a linear position of the at least one gate.

In certain embodiments, the instant disclosure is directed to a method of controlling a slit valve apparatus. The method includes receiving, by a centralized controller, a position trajectory for at least one gate of the slit valve apparatus. The method further includes receiving, by a centralized controller, a linear position measurement from a continuous position sensor that continuously determines a linear position of the at least one gate. The method further includes receiving, by the centralized controller, a fluid pressure and/or a fluid flow measurement from a plurality of controllers that independently measure and/or control fluid pressure and/or fluid flow in a respective supply line to at least one pneumatic actuator. The method further includes generating, by the centralized controller, a control signal based on the position trajectory, the linear position measurement, and the fluid pressure and/or fluid flow measurement in the respective supply lines to the at least one pneumatic actuator. The method further includes transmitting, by the centralized controller, the control signal to the plurality of controllers of the at least one proportional pneumatic valve to adjust the fluid pressure and/or the fluid flow in the respective supply lines to the at least one pneumatic actuator. The method further includes operating, by the centralized controller, the servo-control system to exert force on the at least one gate via at least one moving member of the at least one pneumatic actuator.

In certain embodiments, the instant disclosure is directed to a method including operating a servo-control system to exert force on a gate of a slit valve assembly. The operating includes actuating a proportional pneumatic valve to permit fluid to flow through a plurality of supply lines of a pneumatic actuator of the slit valve assembly. The operating further includes measuring fluid pressure and/or fluid flow in the plurality of supply lines. The operating further includes measuring a linear position of the gate with a continuous position sensor. The operating further includes, in response to the linear position measurement and the fluid pressure and/or fluid flow measurement in the plurality of supply lines, controlling the proportional pneumatic valve with the servo-control system to adjust the fluid pressure and/or fluid flow in the plurality of supply lines. The operating further includes exerting force on the gate by a moving member of the actuator via the fluid flowing through the plurality of supply lines.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION

Figure 1:
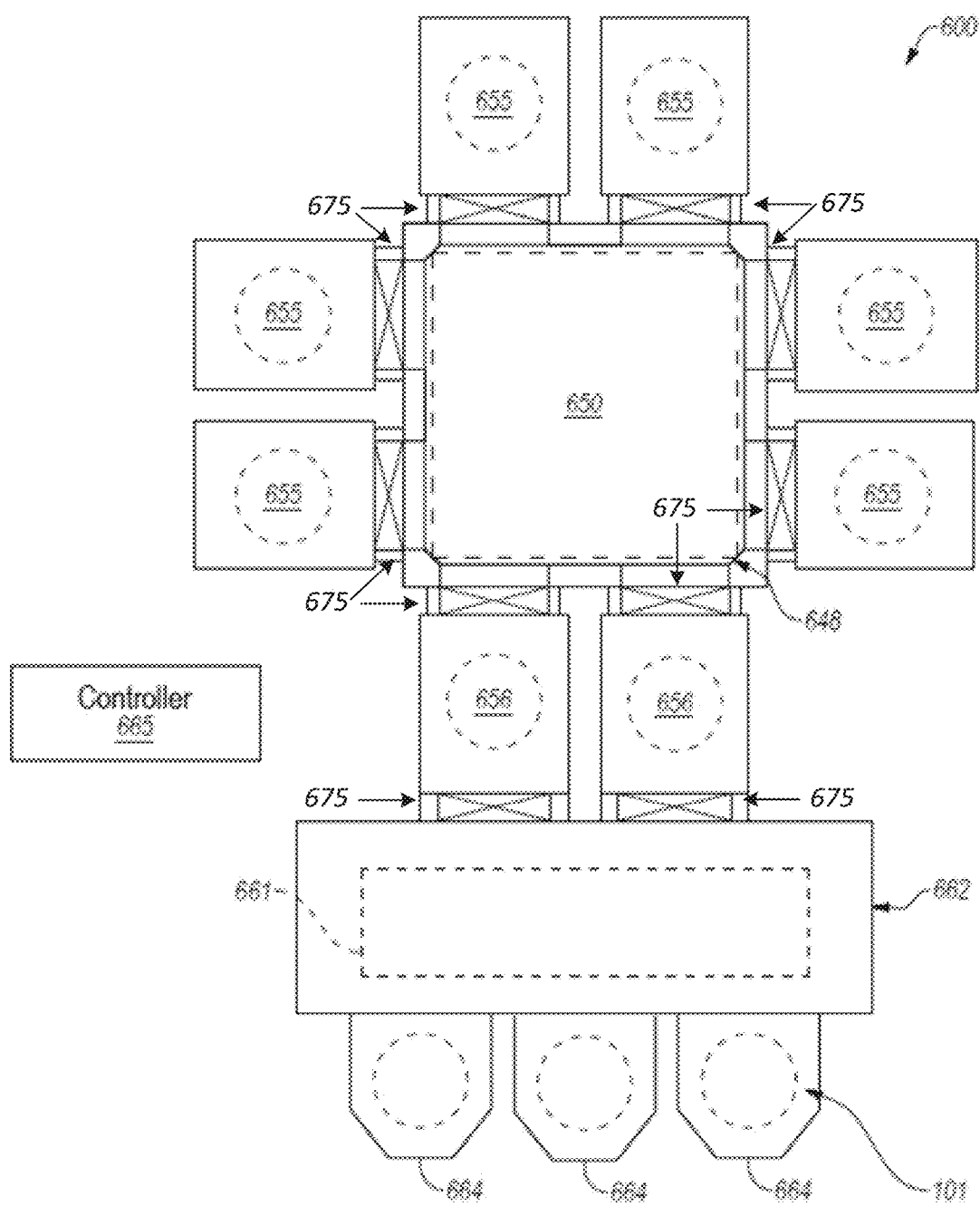
FIG. 1 illustrates a top schematic of a wafer processing system in accordance with embodiments of the present disclosure.

Semiconductor substrates and other substrates are commonly processed in vacuum processing systems and are transferred between one or more chambers through apertures controlled by slit valves assemblies. These slit valve assemblies typically include at least one gate coupled to an actuator used to manipulate the gate. The actuators can be full stroke pneumatic actuators that include one or more pistons for moving the gate from an open position (where the gate is not isolating one chamber from the adjacent chamber) to a closed position (where the gate is isolating one chamber from the adjacent chamber) and vice versa. The pneumatic actuators are typically controlled by an on/off pneumatic switch that either provides full flow or no flow and does not have an otherwise intermediary setting between the full flow and the no flow. Additionally, existing pneumatic slit valve control mechanisms include two discrete sensors located at the end positions of the gate (i.e., one at the closed position and one at the open position). With such conventional pneumatic valve control mechanisms and methodologies, it is challenging to monitor the gate's position along the full stroke at any given time and to adjust the motion profile of the gate in real time. As such, a full actuation force is exerted on a gate in many instances when reduced actuation force would be preferable to achieve the same effect but with reduced particle generation and particle contamination.

The instant disclosure is related to a slit valve apparatus including a slit valve assembly and a servo-control system in communication with the slit valve assembly. The slit valve assembly includes at least one gate configured to transition between an open position and a closed position. The slit valve assembly further includes at least one pneumatic actuator including at least one moving member coupled to the at least one gate. The slit valve assembly further includes at least one proportional pneumatic valve configured to control fluid pressure and/or fluid flow between a pressurized fluid supply or a vent and the at least one pneumatic actuator. The proportional pneumatic valve includes a plurality of controllers each configured to independently measure and/or control fluid pressure and/or fluid flow in a respective supply line to the at least one pneumatic actuator. The slit valve assembly further includes a continuous position sensor configured to continuously determine a linear position of the at least one gate.

One advantage of the slit valve control mechanism described in embodiments herein over conventional slit valve control mechanisms is that it provides real time in-situ knowledge of the whereabouts of the gate throughout the full stroke (i.e., as the gate moves from one end position to another end position) and real time in-situ ability to adjust the motion profile of the gate throughout the full stroke. This advantage may be used to adjust the actuation force that is exerted on a gate on an as-needed basis in order to accelerate the gate, decelerate the gate, pause the gate, or provide additional force on a closed gate depending on the gate's position within the full stroke and depending on how close the gate's motion profile is to the commanded position trajectory for the gate.

For instance, upon the gate approaching an end position (e.g., an open position or a closed position), the force exerted on the gate may be adjusted so as to decelerate the gate and pause the gate upon the gate reaching its end position. In this manner, the gate will reach its end position with a clean and easy stop rather than a hard stop that may contribute to wear, system vibration, particle generation, and wafer defects, as is presently observed with existing slit valve control mechanisms where the gate tends to reach its end position when it moves in its highest velocity (bringing about a hard stop, particle generation, and system vibration).

In certain embodiments, upon the gate initiating movement from an open position towards a closed position or from a closed position towards an open position, the force exerted on the gate may be adjusted so as to accelerate the gate.

In certain embodiments, upon the gate being in a closed position (i.e., where the gate is isolating one chamber from an adjacent chamber), the force exerted on the gate may be increased so that the gate is able to isolate the two adjacent chambers from one another despite a pressure differential between the two adjacent chambers. The force exerted on the gate may be eased up as the pressure differential between the two adjacent chambers decreases.

The slit valve control mechanism described herein may advantageously be used as a diagnostic tool useful for troubleshooting when something within the wafer processing sequence goes wrong. With the existing conventional slit valve control mechanisms, it is challenging to identify what contributed to the gate's failure to reach its end position. In contrast, knowledge of the gate's whereabouts throughout its full stroke and the ability to control the gate's motion in real time throughout its full stroke enables tracking and monitoring any variations in the gate's motion and streamlines troubleshooting and diagnostics in real time.

The slit valve control mechanism described herein may advantageously be used to time other motions that are part of a wafer processing sequence to save time and operate the wafer processing system more efficiently. For instance, knowing the whereabouts of the gate at all times due to the continuous position sensor allows to initiate certain motions within the wafer processing system ahead of time and without waiting for the gate to reach its end position, as is currently done with the existing slit valve control mechanisms. For example, a robot may start moving a wafer from one chamber to an adjacent chamber before the gate isolating the two adjacent chambers fully opens.

As used herein, the singular forms "a," "an," and "the" include plural references unless the context clearly indicates otherwise. Thus, for example, reference to "a wafer" includes a single wafer as well as two or more wafers, and the like.

As used herein, the term "about" in connection with a measured quantity, refers to the normal variations in that measured quantity, as expected by one of ordinary skill in the art in making the measurement and exercising a level of care commensurate with the objective of measurement and the precision of the measuring equipment. In certain embodiments, the term "about" includes the recited number ±10%, such that "about 10" would include from 9 to 11.

As used herein, the term "station" refers to a chamber in which objects that are transferred through a wafer processing system, such as a wafers, may be stored temporarily. A station, as used herein, may be separated from other portions of the wafer processing system with at least one gate.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to illuminate certain materials and methods and does not pose a limitation on scope. No language in the specification should be construed as indicating any non-claimed element as essential to the practice of the disclosed materials and methods.

FIG. 1 illustrates a top schematic of a wafer processing system 600 in accordance with embodiments of the present disclosure. Wafer processing system 600 may include a factory interface 662 (also referred to as "equipment front end module (EFEM)"), a main frame 648 (also referred to as a transfer chamber), one or more processing chambers 655, and one or more load lock chambers 656 according to embodiments described herein. Main frame 648 may be connected to factory interface 662 via the one or more load lock chambers 656. Wafer carriers 664 may be detachably connected to a front wall of the factory interface 662. Factory interface 662 may include a factory interface robot 661 for moving wafer 101 (shown dotted for illustration purposes) and/or other objects (such as process kit ring, etc.) between wafer carriers 664 and load lock chambers 656. For instance, factory interface 662 may include one or more load ports, each of which may receive a wafer carrier 664. An overhead track (OHT) may drop a front opening unified pod (FOUP) onto a load port. Factory interface robot 661 may pick wafer 101 from the FOUP and may optionally align wafer 101 in an aligner (not shown). Subsequently, factory interface robot 661 may place wafer 101 in load lock chamber 656. Thereafter, main frame robot 650 (located in main frame 648) may pick wafer 101 from at least one of load lock chambers 656 and hand wafer 101 to at least one of the one or more processing chambers 655.

As the manufacturing processes progress, the factory interface robot 661 and the main frame robot 650, working in tandem, may move wafers 101 and/or other objects between the wafer carriers 664 and the processing chambers 655. Various electronic device fabrication processes, e.g., semiconductor device manufacturing processes, such as, e.g., oxidation, thin film deposition, etching, heat treatment, degassing, cool down, etc., may take place within process chambers 655.

After processing in at least one of the one or more processing chambers 655 is complete, processed wafer 101 may be picked by main frame robot 650 and handed over to at least one of load lock chambers 656. At least one of load lock chambers 656 may pump its pressure up to atmospheric pressure followed by the processed wafer 101 being picked by the factory interface robot 661 and placed back into the FOUP. After all wafers from wafer carriers 664 are processed, the OHT (not shown) may pick the FOUP and drop it with a different tool as per the designed manufacturing process.

Wafer 101 and/or other objects are transferred between one station to an adjacent station (e.g., between transfer chamber 648 to processing chamber 655, between load lock chamber 656 and transfer chamber 648, between factory interface 662 and load lock chamber 656, and the like) via at least one gate that is a part of a slit valve assembly that may be housed in ports 675. A slit valve assembly according to certain embodiments is described in further detail with respect to FIG. 2. Each slit valve (or gate) is able to transition from a closed position to an open position and vice versa. In the closed position, the slit valve (or gate) isolates one station from an adjacent station. In the open position, the slit valve (or gate) does not isolate one station from the adjacent station and objects are transferable from one station to an adjacent station through the open apertures of two opposing sides of ports 675. The slit valve transitions between a closed position and an open position via a pneumatic slit valve control mechanism, described in further detail with respect to FIGS. 2A, 2B, and 2C.

Exemplary conventional slit valve apparatuses include a gate configured to transition between an open position and a closed position via a moving member of a pneumatic actuator. A pneumatic on/off switch controlled by a servo-control system could be used to move the pneumatic actuator from one position to another (e.g., from open position to closed position or from closed position to open position) by supplying clean dry air (CDA) flow to one side of the actuator and exhausting the other side of the actuator. When the gate reaches the specified position (e.g., open position or closed position), one of two discrete sensors (each located at an end positions of the gate) detects the position of the gate and provides feedback to the servo-control system on the position of the gate.

For instance, with this exemplary conventional slit valve apparatus, a typical operational sequence may proceed as follows. If the gate is closed, the discrete sensor located at the closed position of gate will indicate that the gate is closed. The servo-control system will control the on/off pneumatic switch to move the gate from a closed position to an open position via the moving member of the pneumatic actuator. The moving member will move the gate from a closed position to an open position by supplying CDA flow to one side of the pneumatic actuator and exhausting the other side of the pneumatic actuator. The position of the gate and the moving member during their movement from a closed position to an open position is unknown until the gate reaches the open position, when the discrete open position sensor turns on.

When the gate is open, the discrete open position sensor located at the open position of gate will indicate that the gate is open. The servo-control system will control the on/off pneumatic switch to move the gate from an open position to a closed position via the moving member of the pneumatic actuator. The moving member will move the gate from an open position to a closed position by supplying CDA flow to one side of the pneumatic actuator and exhausting the other side of the pneumatic actuator. The position of the gate and the moving member during their movement from an open position to a closed position is unknown until the gate reaches the closed position, when the discrete closed position sensor turns on.

With this exemplary conventional slit valve apparatus, when the gate begins transitioning from a closed position to an open position, CDA flow begins to flow to one side to actuate movement of the gate, and continues flowing at a steady speed so as to move the gate at a steady speed. With this exemplary apparatus, the gate reaches the end of stroke and the open position (as evidenced by the discrete open position sensor) and hits a hard stop. The point at which the gate hits the hard stop is when the gate is moving at its highest velocity so it slams into a hard stop. This is believed to contribute to vibrations and to particles shaking off at the gate interface, which may contribute to wafer defects.

A similar motion trajectory is also applicable when the gate begins transitioning from an open position to a closed position. CDA flow begins to flow to one side to actuate movement of the gate, and continues flowing at a steady speed so as to move the gate at a steady speed. With this exemplary apparatus, the gate reaches the end of stroke and the closed position (as evidenced by the discrete close position sensor) and hits a hard stop. The point at which the gate hits a hard stop is when the gate is moving at its highest velocity so it slams into a hard stop which is believed to contribute to vibrations and to particles shaking off at the gate interface and to wafer defects.

Such particle generation may be mitigated by controlling the motion profile of the gate so that the velocity of the gate is ramped up in certain portions of its motion trajectory and slowed down in other portions of the gate's motion trajectory, whether it moves from a closed position to an open position or from an open position to a closed position.

Conventional slit valve apparatuses monitor the position of the gate only with end position sensors. Hence, the whereabouts of the gate is unknown during the gate's movement between open position and closed position. Continuously monitoring the position of gate would enable controlling its motion profile such that the gate may slow down as it approaches its end positions and come to a clean, slow, and gentle stop rather than the hard stop that is presently experiences.

Figure 2A:
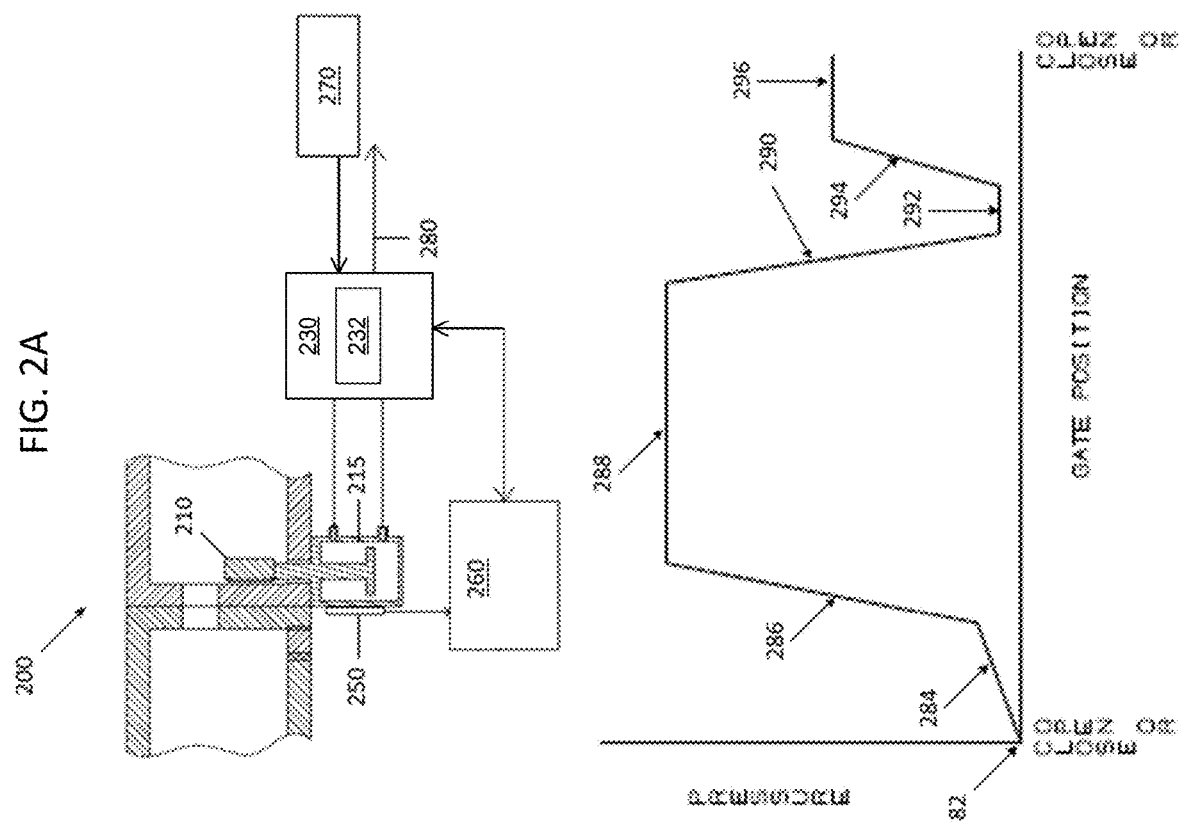
FIG. 2A illustrates a simplified view of a slit valve apparatus in accordance with embodiments of the present disclosure where the gate is in an open position.
Figure 2B:
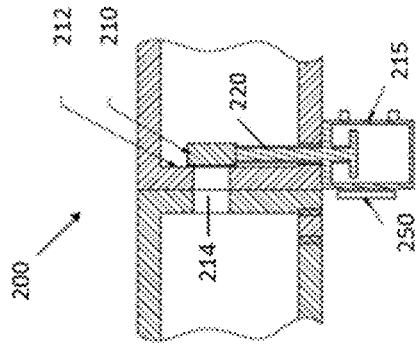
FIG. 2B illustrates a simplified view of a slit valve apparatus in accordance with embodiments of the present disclosure where the gate is in closed position.

FIG. 2A illustrates a simplified view of a slit valve apparatus for controlling a slit valve in accordance with embodiments of the present disclosure in which the gate is in an open gate position. FIG. 2B illustrates a simplified view of a slit valve apparatus for controlling a slit valve in accordance with embodiments of the present disclosure in which the gate is in a closed gate position.

The slit valve apparatus includes a slit valve assembly 200 that may be housed in port 675, depicted in FIG. 1, and a servo-control system (such as controller 665 in FIG. 1), in communication with the slit valve assembly 200, to control the slit valve assembly 200. In certain embodiments, the slit valve apparatus includes a plurality of slit valve assemblies, each of the slit valve assemblies independently housed in one of ports 675. The servo-control system (such as controller 665 in FIG. 1) may be in communication with the plurality of slit valve assemblies and may control the plurality of slit valve assemblies. In certain embodiments, the servo-control system (such as controller 665 in FIG. 1) may be the same as centralized controller 260.

In certain embodiments, slit valve assembly 200 includes at least one gate 210 configured to transition between an open position (shown in FIG. 2A) and a closed position (shown in FIG. 2B). Slit valve assembly 200 further includes a pneumatic slit valve control mechanism that includes at least one pneumatic actuator 215 including at least one moving member 220 coupled to the at least one gate 210 and configured to exert force on the at least one gate 210. In certain embodiments, the at least one pneumatic actuator 215 includes one or a series of pneumatic cylinders for moving the slit valve from one end position to another end position. The pneumatic slit valve control mechanism further includes at least one proportional pneumatic valve 230 configured to control fluid pressure and/or fluid flow between a pressurized fluid supply or a vent and the at least one pneumatic actuator. Each proportional pneumatic valve 230 further includes a plurality of controllers 232 (e.g., fluid pressure and/or fluid flow controllers) each configured to independently measure and/or control fluid pressure and/or fluid flow in respective supply lines to the at least one pneumatic actuator 215. The pneumatic slit valve control mechanism further includes a continuous position sensor 250 configured to continuously determine a linear position of the at least one gate 210.

The servo-control system (such as controller 665 in FIG. 1) may include a centralized controller 260 in communication with each pneumatic slit valve control mechanism. In certain embodiments, the centralized controller is a standard controller configured to interact with multiple other controllers. Each centralized controller 260 may be in communication with the at least one proportional pneumatic valve 230 (e.g., to include the plurality of fluid pressure and/or fluid flow controllers 232), and the continuous position sensor 250. In certain embodiments, each of the centralized controllers 260 and/or the plurality of fluid pressure and/or fluid flow controllers 232 may be modules of the servo-control system. The servo-control system is configured to maintain a closed loop that accounts for the target position profile of the at least one gate (i.e., the position trajectory or the commanded position), the linear position measurement of the at least one gate (i.e., the real time/in-situ actual position/motion profile of the at least one gate), and the error between the real time/in-situ actual position/motion profile of the at least one gate and the position trajectory (or commanded position), and provides feedback to the pneumatic slit valve control mechanism to adjust various constituents of the pneumatic slit valve control mechanism (e.g., the proportional pneumatic valve 230 and the plurality of controllers 232) in order to adjust the actuation of the at least one gate so that it follows the commanded position trajectory more closely. Calculating the error between the commanded position trajectory and the actual real-time/in-situ position measurement and adjusting the actuation to correct for this error may be performed using a proportional-integral-derivative (PID) controller.

In certain embodiments, the centralized controller 260 designated for each slit valve assembly 200 is configured to: receive a position trajectory (also may be referred to as a commanded position) for the at least one gate 210, receive the linear position measurement of the at least one gate 210 from the continuous position sensor 250 (also may be referred to as an actual real-time/in-situ position measurement), and receive fluid pressure and/or fluid flow measurement in the respective supply lines to the at least one pneumatic actuator from the plurality of fluid pressure and/or fluid flow controllers 232 in the proportional pneumatic valve 230. A "fluid pressure and/or fluid flow measurement" refers to the actual real-time/in-situ fluid pressure and/or fluid flow in the respective supply lines.

In certain embodiments, the centralized controller 260 is further configured to generate a control signal based on the position trajectory, the linear position measurement, and the fluid pressure and/or fluid flow measurement. The continuous position sensor 250 generates the linear position measurement that provides knowledge as to the whereabouts of the gate 210 throughout its full stroke (i.e., its full movement between the open position and the closed position). In certain embodiments, the continuous position sensor 250 is configured to generate a continuous analog output or a continuous digital output indicative of the linear position in in real time/in-situ of the at least one gate 210 throughout its motion from the open position to the closed position and vice versa. Non-limiting examples of suitable continuous position sensors include at least one of a varistor, an inductive sensor, an encoder, a light based system, or a capacitive based system.

The centralized controller 260 may calculate the error between the gate's commanded position trajectory and actual real-time/in-situ position (obtained from the gate's linear position measurement by the continuous position sensor 250). The centralized controller could account for the calculated error and the measured fluid pressure and/or fluid flow in the plurality of supply lines, and generate a control signal to adjust the fluid pressure and/or fluid flow in the respective supply lines so as to actuate the at least one gate closer to the commanded position trajectory.

In certain embodiments, the centralized controller 260 is further configured to transmit the control signal to the at least one proportional pneumatic valve 230 and/or to the plurality of controllers 232. Transmitting the control signal to the at least one proportional pneumatic valve 230 assists in controlling the fluid pressure and/or fluid flow between a pressurized fluid supply 270 or a vent 280 and the at least one pneumatic actuator 215. Transmitting the control signal to the plurality of controllers 232 of the at least one proportional pneumatic valve 230 also assists in controlling the fluid pressure and/or fluid flow in the respective supply lines to the at least one pneumatic actuator 215. The fluid pressure and/or fluid flow between the pressurized fluid supply line 270 or vent 280 and the at least one pneumatic actuator 215 together with the fluid pressure and/or fluid flow in the respective supply lines in the at least one proportional pneumatic valve 230 to the at least one pneumatic actuator 215 control the force exerted by the moving member 220 of the at least one actuator on the at least one gate 210.

In certain embodiments, the proportional pneumatic valve 230 includes an analog control configured to vary fluid flow between full flow and no flow. A variety of proportional pneumatic valves may be suitably utilized in the slit valve apparatuses described herein. For instance, in certain embodiments, the proportional pneumatic valve is a poppet valve or a proportional spool valve. In certain embodiments, a plurality of proportional pneumatic valves may be utilized in the pneumatic slit valve control mechanism. For instance, one proportional pneumatic slit valve 230 may control the fluid pressure and/or fluid flow between the pressurized fluid supply line or vent and the at least one pneumatic actuator 215 and a plurality of discrete proportional pneumatic slit valves may be placed in each discrete supply line to the at least one pneumatic actuator.

In certain embodiments, the centralized controller 260 is further configured to operate the servo-control system to exert force on the at least one gate 210 via the at least one moving member 220 of the at least one pneumatic actuator. The force exerted by the moving member 220 of the at least one pneumatic actuator 215 on the at least one gate 210 may be controlled by the fluid pressure and/or fluid flow in the respective supply lines to the at least one pneumatic actuator 215.

One advantage of the slit valve control mechanism described herein over conventional slit valve control mechanisms is that it provides real time/in-situ knowledge of the actual whereabouts of the gate throughout the full stroke (i.e., as the gate moves from one end position to another end position) and real time/in-situ ability to adjust the motion profile of the gate throughout the full stroke. This advantage may be used to accelerate, decelerate, pause, decrease or increase the force exerted on the gate depending on its position within the full stroke.

For instance, upon the gate approaching an end position (e.g., an open position or a closed position), the control signal, generated by the centralized controller, may be configured to adjust the fluid pressure and/or fluid flow in the respective supply lines to the at least one pneumatic actuator so as to decelerate the gate as it approaches its end position and pause the gate upon the gate reaching its end position. In this manner, the gate will reach its end position with a clean and easy stop rather than a hard stop that may contribute to wear, system vibration, particle generation, and wafer defects.

In certain embodiments, upon the gate initiating movement from an open position towards a closed position or from a closed position towards an open position, the control signal may be configured to adjust the fluid pressure and/or fluid flow in the respective supply lines to the at least one actuator so as to accelerate the gate.

In certain embodiments, upon the gate being in a closed position (i.e., where the gate is isolating one chamber from an adjacent chamber), the control signal may be configured to adjust the fluid pressure and/or fluid flow in the respective supply lines to the at least one pneumatic actuator so as to increase the force exerted on the gate so that the gate is able to isolate the two adjacent chambers from one another despite the pressure differential between the two adjacent chambers.

In certain embodiments, the fluid pressure to the respective supply lines to the at least one pneumatic actuator ranges from about 10 psig to about 90 psig, from about 20 psig to about 80 psig, from about 10 psig to about 45 psig, from about 20 psig to about 45 psig, from about 55 psig to about 80 psig, and any other range or value therein. In certain embodiments, when the pressure differential between a first station proximate to a first side of the gate and a second station proximate to a second side of the gate that is opposite the first side is less than 300 Torr, the fluid pressure to the respective supply lines to the at least one pneumatic actuator may range from about 10 psig to about 45 psig, from about 10 psig to about 30 psig, from about 15 psig to about 50 psig, from about 20 psig to about 45 psig, or from about 30 psig to about 40 psig. In certain embodiments, when the pressure differential between a first station proximate to a first side of the gate and a second station proximate to a second side of the gate that is opposite the first side is greater than 300 Torr, the fluid pressure to the respective supply lines to the at least one pneumatic actuator ranges from about 50 psig to about 90 psig, from about 55 psig to about 80 psig, or from about 60 psig to about 70 psig. The term "chambers" and "stations" are used interchangeably herein. With a larger pressure differential between two adjacent chambers (or two adjacent stations) a larger fluid pressure may be utilized in the supply lines to the at least one actuator to exert a larger force on the gate so that the gate may continue to effectively isolate the two adjacent chambers despite the larger pressure differential between them. Similarly, with a smaller pressure differential between two adjacent chambers/stations a lower fluid pressure may be utilized in the supply lines to the at least one actuator to exert a lesser force on the gate, since with a lower pressure differential, a lower force may still isolate the two adjacent chambers effectively. In some embodiments, exerting a lower force, when possible, may be beneficial in reducing the number of particles that get generated (as described in further detail with respect to FIG. 5 below). The fluid pressure utilized in the supply lines to the at least one actuator depend on the actuator used and on what side of the gate the pressure is higher. However, the fluid pressure can be controlled (i.e., increased or decreased) based, among other factors, on the position feedback of the gate.

The slit valve control mechanism described herein may advantageously be used as a diagnostic tool useful for troubleshooting when something within the wafer processing sequence goes wrong. For instance, over time actuators may become sticky and their friction may change. Occasionally, the friction may increase so much that the actuator may halt mid-way through its motion and fail to complete the full stroke to reach its end position (e.g., open position or closed position). In some instances, seals located on the gate and/or on the apertures that are being sealed may dry out which could also contribute to a change in the friction experienced by the actuator. In some instances, the o-ring on the gate or on the apertures that are being sealed may begin to sag and collapse. In some instances, the gate could have been commanded to move in an untimely manner due to some hardware or software problem and the gate may fail to complete its full stroke to reach its commanded end position because it closes on a robot's arm. With the existing conventional slit valve control mechanisms, it is very challenging to identify what contributed to the gate's failure to reach its end position. In contrast, knowledge of the gate's actual real time/in-situ whereabouts throughout its full stroke and the ability to control the gate's motion in real time/in-situ throughout its full stroke enables tracking and monitoring any variations in the gate's motion and streamlines troubleshooting and diagnostics in real time.

For instance, there may be a baseline for the fluid pressure and/or fluid flow profile in the respective supply lines to the at least one actuator in order to attain a commanded position trajectory of a particular gate. In one embodiment, the baseline could be the fluid pressure and/or fluid flow profile in the respective supply lines to the at least one actuator from a run that is immediately preceding the instant run. Alternatively, the baseline could be the fluid pressure and/or fluid flow profile in the respective supply lines to the at least one actuator from a standard run conducted for a particular gate upon its initial instillation. The term "run" refers herein to a gate transitioning from one end position (e.g., open position or closed position) to another end position (e.g., open position or closed position) through the full stroke. A deviation of the real-time/in-situ actual fluid pressure and/or fluid flow profile in the respective supply lines to the at least one actuator as compared to baseline could prompt troubleshooting as to what could be the source of the deviation.

The slit valve control mechanism described herein may advantageously be used to time other motions that are part of a wafer processing sequence to save time and operate the wafer processing system more efficiently. For instance, knowing the actual real time/in-situ whereabouts of the gate at all times due to the continuous position sensor allows to initiate certain motions within the wafer processing system ahead of time and without waiting for the gate to reach its end position, as is currently done with the existing slit valve control mechanisms. For example, a robot may start moving a wafer from one chamber to an adjacent chamber before the gate isolating the two adjacent chambers fully opens.

Figure 3:
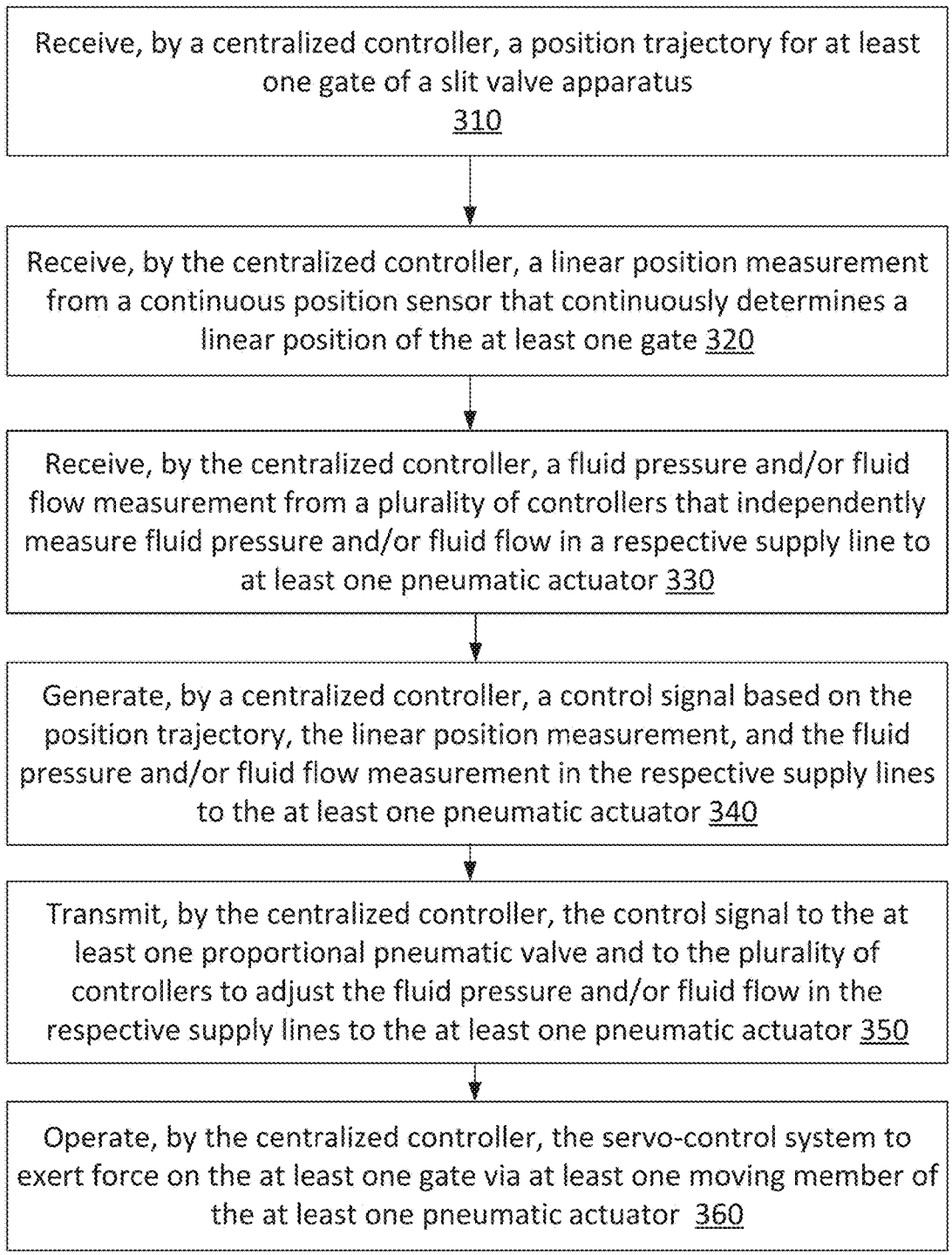
FIG. 3 is a flow chart of a method for controlling a slit valve apparatus in accordance with embodiments of the present disclosure.

Also disclosed herein are methods for controlling a slit valve apparatus. FIG. 3 is a flow chart of a method 300 for controlling a slit valve apparatus in accordance with embodiments of the present disclosure. The method 300 may be used for transitioning a gate between a closed position (where the gate is isolating two adjacent chambers) and an open position (where the gate is not isolating two adjacent chambers).

In certain embodiments, method 300 includes a centralized controller receiving a position trajectory (also referred to herein as "commanded position trajectory" or "commanded position") for at least one gate 210 of a slit valve apparatus (310). The commanded position trajectory may include a fluid pressure and/or fluid flow profile for respective supply lines to the at least one actuator over the full stroke (i.e., the full motion of the gate from one end position to another end position). The phrase "end position" refers to a closed position and an open position. However, in certain embodiments, an end position may also be somewhere between the closed position and the open position, e.g., mid-way through the full stroke. An example of a closed position is depicted in FIG. 2B, where gate 210 is closed against sealing surface 212 and closes/seals aperture 214 entirely. An example of an opened position is depicted in FIG. 2A, where gate 210 does not close/seal aperture 214 and is not in contact with sealing surface 212.

In certain embodiments, method 300 includes a centralized controller receiving a linear position measurement (also referred to herein as "real-time" or "in-situ" or "actual" position measurement) from a continuous position sensor 250 that continuously determines a linear position of the at least one gate 210 (320). The linear position measurement may include real-time, in-situ, actual continuous analog output or a continuous digital output indicative of the linear position of the at least one gate 210 throughout its motion along the full stroke (e.g., from the open position to the closed position and vice versa). As described with respect to FIG. 2, the continuous position sensor may include at least one of a varistor, an inductive sensor, an encoder, a light based system, or a capacitive based system.

In certain embodiments, method 300 includes a centralized controller receiving fluid pressure and/or fluid flow measurements from a plurality of controllers that independently measure fluid pressure and/or fluid flow in respective supply lines to the at least one actuator at various points throughout the full stroke (330).

In certain embodiments, based on the commanded position trajectory of the gate, the linear position measurement of the gate, and the fluid pressure and/or fluid flow measurement in the respective supply lines to the at least one pneumatic actuator, the centralized controller may calculate an error between the commanded position trajectory and the yielded position measurement and may generate a control signal configured to adjust the fluid pressure and/or fluid flow in the respective supply lines to the at least one actuator so that the real-time linear position measurement of the gate correlates more closely to the commanded position trajectory for the gate (440).

In certain embodiments, method 300 further includes the centralized controller transmitting the control signal to the plurality of controllers of the at least one proportional pneumatic valve to adjust the fluid pressure and/or fluid flow in the respective supply lines to the at least one actuator so that the real-time linear position measurement of the gate correlates more closely to the commanded position trajectory for the gate (350). Transmitting the control signal to the at least one proportional pneumatic valve assists in controlling the fluid pressure and/or fluid flow between the pressurized fluid supply line 270 or vent 280 and the at least one pneumatic actuator 215. Transmitting the control signal to the plurality of controllers assists in controlling the fluid pressure and/or fluid flow in the respective supply lines to the at least one pneumatic actuator. The fluid pressure and/or fluid flow between the pressurized fluid supply line or vent and the at least one pneumatic actuator together with the fluid pressure and/or fluid flow in the respective supply lines to the at least one pneumatic actuator control the force exerted by the moving member of the at least one actuator on the at least one gate.

In certain embodiments, method 300 includes a centralized controller operating the servo-control system to exert force on the at least one gate via the at least one moving member of the at least one pneumatic actuator (360), as described in further detail with respect to the process depicted in FIG. 4 below.

One advantage of the slit valve control methodology described herein over conventional slit valve control methodologies is that it the method can provide real-time/in-situ feedback (i.e., adjust the motion profile of the gate in real time/in-situ at any point during its motion from one end position to another end position) in response to an error between the commanded position trajectory and the actual position of the gate throughout the full stroke (i.e., real time in-situ measurement of the gate's motion as the gate moves from one end position to another end position). This advantage may be used to accelerate, decelerate, pause, or adjust the force exerted on the gate depending on its position within the full stroke.

Figure 2C:
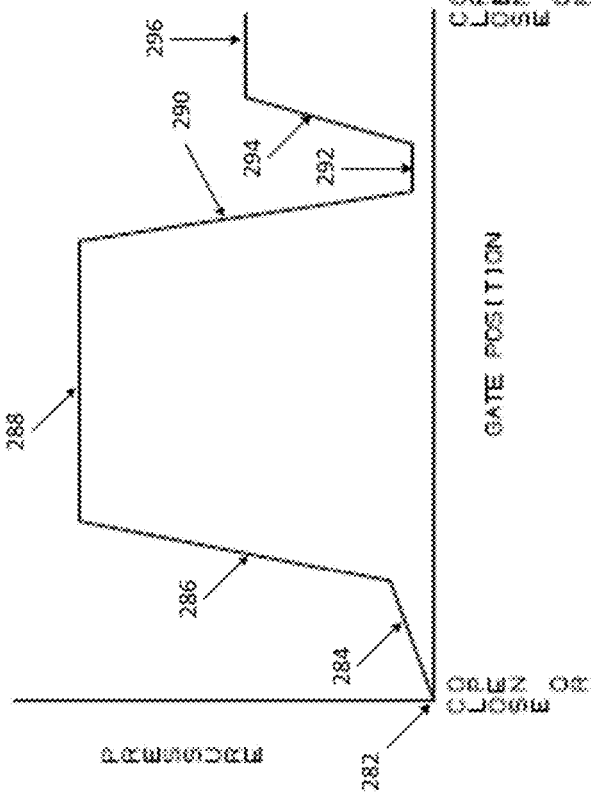
FIG. 2C illustrates an exemplary pressure profile of a slit valve apparatus during operation from an open gate position to a closed gate position and from a closed gate position to an open gate position in accordance with an embodiment of the present disclosure.

FIG. 2C illustrates an exemplary pressure profile of a slit valve apparatus during operation from an open gate position to a closed gate position and from a closed gate position to an open gate position in accordance with an embodiment of the present disclosure.

For instance, the gate begins from an open position or a closed position at point 282. The centralized controller causes the plurality of controllers of the at least one proportional pneumatic valve to adjust the fluid pressure and/or fluid flow in the respective supply lines to the at least one pneumatic actuator so as to increase the pressure applied on the moving member and accelerate the gate, as depicted in regions 284 and 286.

According to embodiments, the gate may be accelerated to a speed of about 1 mm/s to about 150 mm/s, or about 5 mm/s to about 100 mm/s, about 10 mm/s to about 50 mm/s, or about 15 mm/s to about 40 mm/s, or about 20 mm/s to about 30 mm/s, or about 30 mm/s to about 35 mm/s, or about 30 mm/s, or about 35 mm/s, or about 50 mm/s, or any single value or sub-range therein. These numbers should not be construed as limiting as they depend, among other factors, on the actuator that is being used.

Thereafter, the centralized controller may cause the plurality of controllers of the at least one proportional pneumatic valve to adjust the fluid pressure and/or fluid flow in the respective supply lines to the at least one pneumatic actuator so as to maintain a constant pressure on the moving member to move the at least one gate at a steady state, as depicted in region 288.

Upon the gate approaching an end position (e.g., an open position or a closed position), the centralized controller may cause the plurality of controllers of the at least one proportional pneumatic valve to adjust the fluid pressure and/or the fluid flow in the respective supply lines to the at least one pneumatic actuator so as to decrease the pressure on the moving member and decelerate the at least one gate (depicted in region 290) and pause the at least one gate upon reaching the end position (depicted in region 292).

According to embodiments, the gate may be decelerated to a speed of up to about 50 mm/s, or up to about 40 mm/s, or up to about 30 mm/s, up to about 20 mm/s, up to about 15 mm/s, up to about 10 mm/s, up to about 5 mm/s, up to about 3 mm/s, up to about 1 mm/s, or up to about 0.5 mm/s, or any single value or sub-range therein. These numbers should not be construed as limiting as they depend, among other factors, on the actuator that is being used.

In this manner with the exemplary profile depicted in FIG. 2C, the gate will reach its end position with a clean and easy stop rather than a hard stop that may contribute to wear, system vibration, particle generation, and wafer defects.

In certain embodiments, upon the gate being in a closed position (i.e., where the gate is isolating one chamber from an adjacent chamber), the centralized controller may cause the plurality of controllers of the at least one proportional pneumatic valve to adjust the fluid pressure and/or the fluid flow in the respective supply lines to the at least one pneumatic actuator so as to increase the pressure exerted on the gate so that the gate is able to isolate the two adjacent chambers from one another despite the pressure differential between the two adjacent chambers. Thus, after the gate has become closed, the pressure on the gate may be increased to improve a seal, as depicted in region 294.

Upon reaching a pressure that can adequately isolate one chamber from another in the closed gate position, the centralized controller may cause the plurality of controllers of the at least one proportional pneumatic valve to adjust the fluid pressure and/or fluid flow in the respective supply lines to the at least one pneumatic actuator so as to maintain a constant pressure on the moving member, as depicted in region 296.

Figure 4:
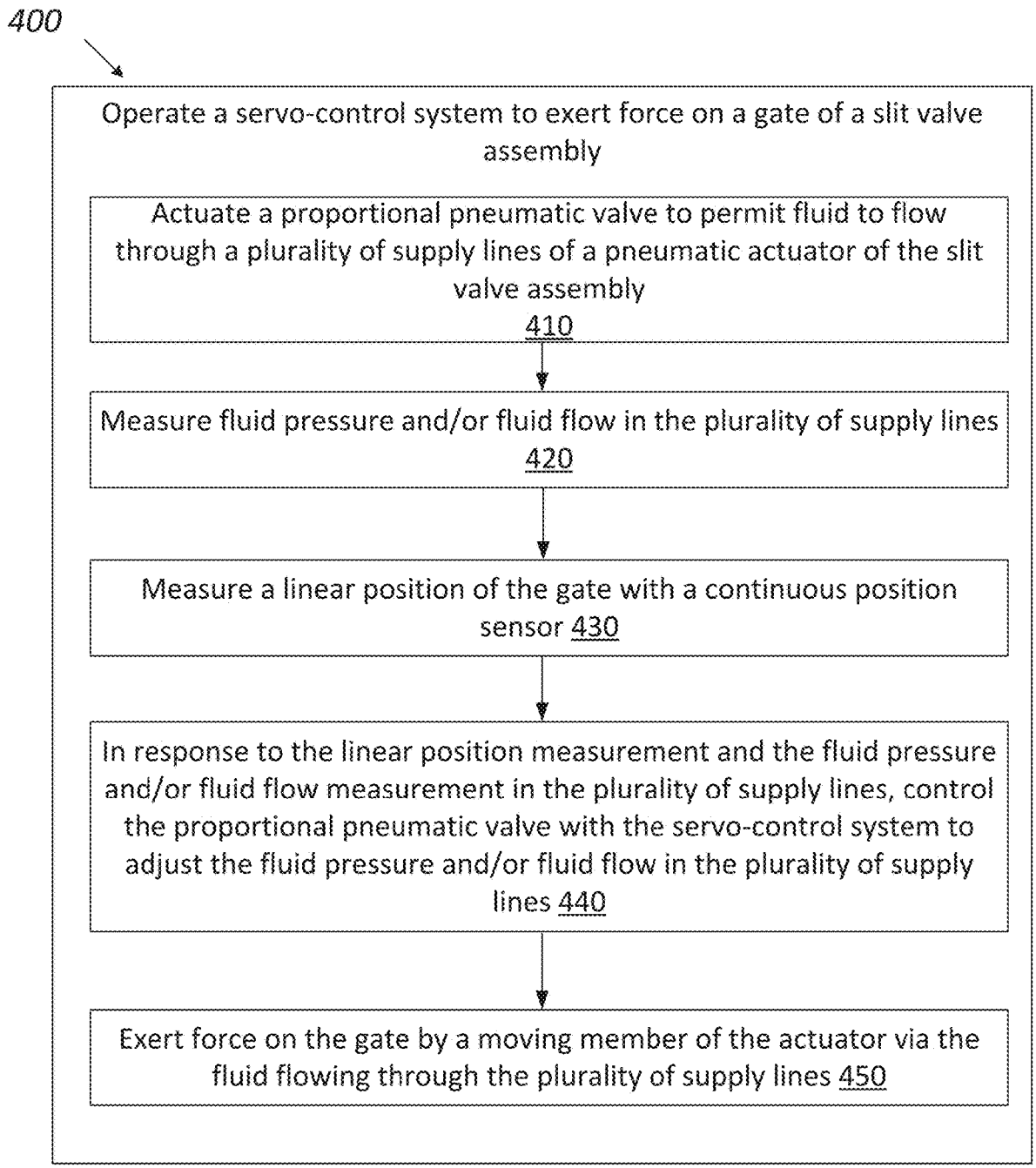
FIG. 4 is a flow chart of a method for operating a servo-control system to exert force on a gate of a slit valve assembly in accordance with embodiments of the present disclosure.

FIG. 4 is a flow chart of a method 400 for operating a servo-control system to exert force on a gate of any of the slit valve assemblies described herein, in accordance with embodiments of the present disclosure. In certain embodiments, method 400 includes actuating a proportional pneumatic valve to permit fluid to flow through a plurality of supply lines of a pneumatic actuator of the slit valve assembly (410). In certain embodiments, the respective supply lines may further include a plurality of discrete proportional pneumatic valves for each respective supply line and those may also be actuated to permit fluid to flow through the respective supply lines.

In certain embodiments, method 400 further includes measuring fluid pressure and/or fluid flow in the plurality of supply lines (420). In certain embodiments, method 400 further includes measuring a linear position of the gate with a continuous position sensor (430). The continuous position sensor may include real-time, in-situ, actual continuous analog output or a continuous digital output indicative of the linear position of the at least one gate 210 throughout its motion along the full stroke.

In certain embodiments, method 400 further includes, in response to the linear position measurement and the fluid pressure and/or fluid flow measurement in the plurality of respective supply lines, control the proportional pneumatic valve with the servo control system to adjust the fluid pressure and/or the fluid flow in the plurality of supply lines so that the real-time linear position measurement of the gate correlates more closely to the commanded position trajectory for the gate (440).

In certain embodiments, method 400 further includes exerting force on the at least one gate by a moving member of the actuator via the fluid flowing through the plurality of the respective supply lines to the at least one actuator (450).

Figure 5:
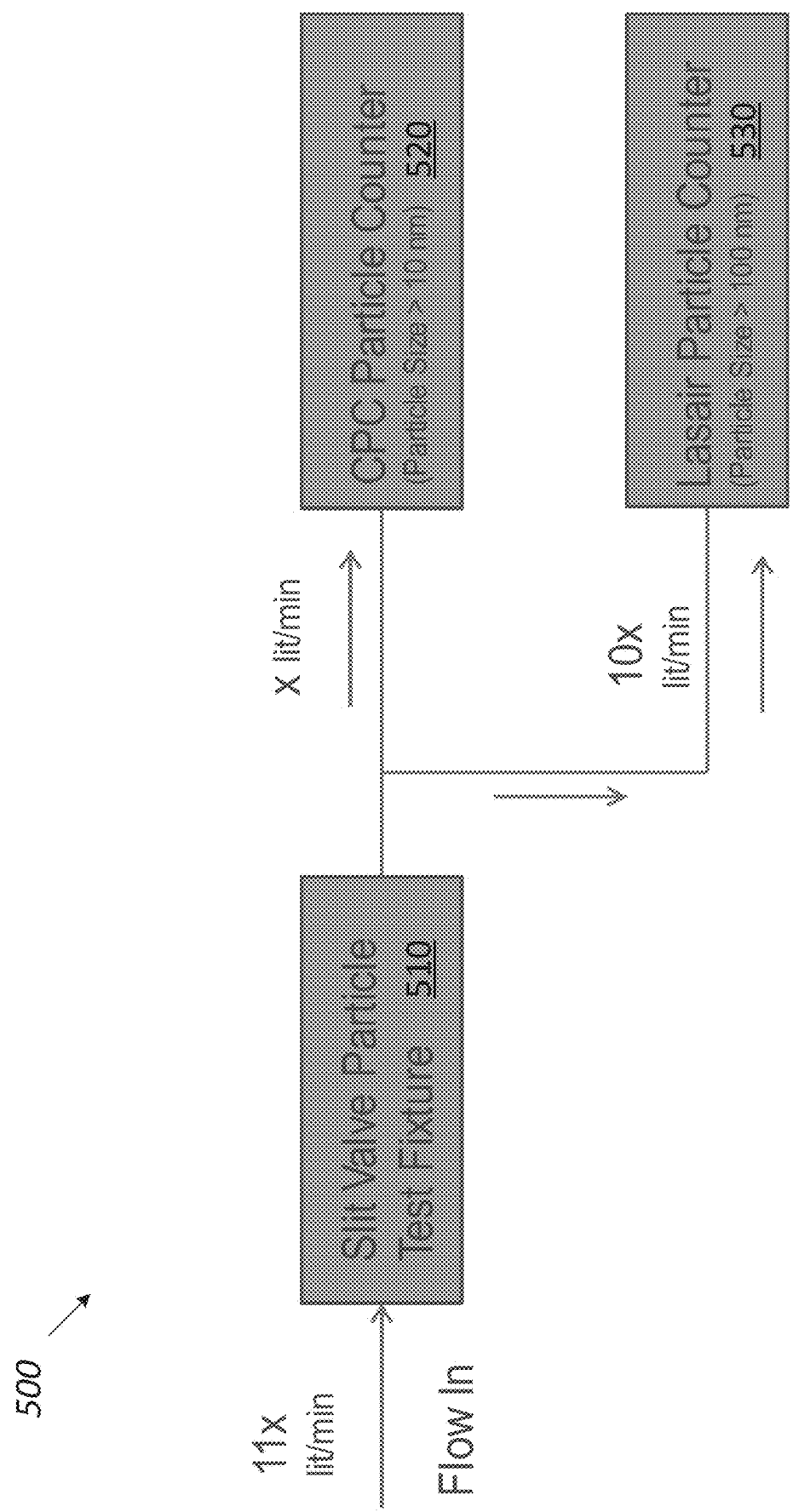
FIG. 5 is a model for testing the number of particles generated from a gate controlled by a method for controlling a slit valve apparatus in accordance with embodiments of the present disclosure.

The model in FIG. 5 was utilized for testing the number of particles generated from a gate controlled slit valve control mechanism and methodology described herein. Model 500 includes a slit valve particle test fixture 510 that includes a slit valve that transitions between an open position and a closed position. Model 500 further includes a CPC particle counter 520 configured to account for particles having a size that is greater than about 10 nm but less than about 100 nm. Model 500 further includes a Lasair particle counter 530 configured to account for particles having a size that is greater than about 100 nm. The model uses the assumptions that both particle counters (520 and 530) accurately account for all particles that they see and that the flow is homogenous (i.e., the concentration and distribution of particles is the same for all air leaving the fixture 510).

In the experiment conducted on model 500, air was delivered into the slit valve particle test fixture 510 at a rate designated as 11× lit/min. The air exiting from the slit valve particle test fixture 510 was distributed such as air flow at a rate 1× lit/min was directed into the CPC particle counter 520 and air flow at a rate 10× lit/min was directed into the Lasair particle counter 530. This experiment illustrates that applying a higher actuating pressure on a slit valve during final closure of the slit valve, increases the number of particles generated. The results are summarized with respect to Table 1 below.

TABLE 1

Total Number of Particles After 96 Hours of Cycling At Various External CDA Pressures

| Lasair III-Particle Performance (Particle Size > 100 nm) | | | |
| --- | --- | --- | --- |
| External CDA Pressure (psig) | 40 | 60 | 40 |
| Total # of Particles after 96 hours of Cycling | 168 | 2200 | 224 |
| NPC 10-Particle Performance (Particle Size > 10 nm) | | | |
| External CDA Pressure (psig) | 40 | 60 | 40 |
| Total # of Particles after 96 hours of Cycling | 38 | 1621 | 209 |

As can be seen from Table 1, when the external clean dry air (CDA) actuating pressure on the slit valve is 40 psig at closure, the number of particles (for both sizes—greater than 10 nm and greater than 100 nm) is negligible. In comparison, when the external CDA actuating pressure on the slit valve is 60 psig at closure, the number of particles (for both sizes—greater than 10 nm and greater than 100 nm) is significantly increased. Upon reduction of the external CDA actuating pressure back to 40 psig, the number of particles decreases significantly again. This confirms the hypothesis that controlling the actuation pressure and correspondingly the actuation force that is applied on a slit valve at closure can minimize the number of particles generated when operating a slit valve and assist in reducing wafer defects arising for increased particle contamination.

With the slit valve control mechanism and methodology described herein, the actuation pressure and correspondingly the actuation force that is exerted on the gate may be adjusted on an as-needed basis. For instance, when the gate is in a closed position isolating between two adjacent chambers, a greater actuation force may be exerted on the gate if the two adjacent chambers have a large pressure differential between them (e.g., when one chamber is in vacuum and another chamber is at atmospheric pressure). As the pressure differential between the two adjacent chambers decreases (e.g., as both chambers reach vacuum or when both chambers are at atmospheric pressure), the actuation force may ease off to exert a smaller actuation force on the gate and reduce the number of particles generated as the gate is approaching closure.

In one embodiment, servo-control of the gate can be implemented via a control algorithm for controlling the slit valve apparatus. The control algorithm may be implemented by executing programs (software) based on predetermined recipes.

Further, it is to be understood that the methods disclosed herein may be attained by supplying to a computer e.g., a control unit) a storage medium in which a program code of software that realizes the functions of the aforementioned embodiments is stored, and then causing a processor (e.g., a central processing unit (CPU)) of the computer to read out and execute the program code stored in the storage medium. Alternatively another type of processing device such as a programmable logic controller (PLC) system on a chip (SoC), etc. may execute the program code. The processor or processing device executing the program code may cause slit valves to open and/or close, wafers to be moved between locations by robots, and so on.

In this case, the program code itself read out from the storage medium realizes the functions of the aforementioned embodiments and, hence, the program code and the storage medium in which the program code is stored are also part of the disclosure.

Moreover, the storage medium for Supplying the program code may be, e.g., an RAM, an NV-RAM, a floppy (registered trademark) disk, a hard disk, a magnetic-optical disk, an optical disk such as a CD-ROM, a CD-R, a CD-RW, a DVD (a DVD-ROM, a DVD-RAM, a DVD-RW, a DVD+ RW) or the like, a magnetic tape, a non-volatile memory card, another ROM or the like. Alternatively, the program code may be supplied to the computer by downloading from another computer (not shown), a database (not shown) or the like connected to the Internet, a commercial network, an LAN (local area network) or the like.

Besides, it is to be understood that the functions of the aforementioned embodiments may be accomplished not only by executing the program code read out by the computer, but also by causing an OS (operating system) or the like that operates on the processing device to perform a part or all of the actual operations based on instructions of the program code.

The program codes may take the form of an object code, a program code executed by an interpreter, script data supplied to an OS, or the like.

In the foregoing description, numerous specific details are set forth, such as specific materials, dimensions, processes parameters, etc., to provide a thorough understanding of the present disclosure. The particular features, structures, materials, or characteristics may be combined in any suitable manner in one or more embodiments. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is simply intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. Reference throughout this specification to "an embodiment", "certain embodiments", or "one embodiment" means that a particular feature, structure, or characteristic described in connection with the embodiment is included in at least one embodiment. Thus, the appearances of the phrase "an embodiment", "certain embodiments", or "one embodiment" in various places throughout this specification are not necessarily all referring to the same embodiment.

Embodiments of the present disclosure have been described with reference to specific exemplary embodiments thereof. The specification and drawings are, accordingly, to be regarded in an illustrative rather than a restrictive sense. Various modifications of the disclosure in addition to those shown and described herein will become apparent to those skilled in the art and are intended to fall within the scope of the appended claims.

We claim:

1. A slit valve apparatus for controlling a slit valve, the slit valve apparatus comprising:
    a slit valve assembly, comprising:
        a gate configured to transition between an open position and a closed position;
        a pneumatic actuator comprising a moving member coupled to the gate, the moving member configured to exert a force on the gate;
        a plurality of supply lines coupled to the pneumatic actuator;
        a proportional pneumatic valve coupled to the plurality of supply lines, to a pressurized fluid supply, and to a vent, the proportional pneumatic valve comprising a plurality of controllers each configured to independently measure and control at least one of fluid pressure or fluid flow in a respective supply line of the plurality of supply lines; and
        a continuous position sensor configured to continuously determine a linear position of the gate; and
    a centralized controller in communication with the slit valve assembly and configured to:
        receive a position trajectory for the gate;
        receive a linear position measurement of the gate from the continuous position sensor;
        receive at least one of fluid pressure or fluid flow measurement in the plurality of supply lines from the plurality of controllers;
        generate control signals based on the position trajectory, the linear position measurement, and the at least one of fluid pressure or fluid flow measurement in each of the plurality of supply lines; and
        transmit respective control signals to respective controllers of the plurality of controllers to adjust the at least one of fluid pressure or fluid flow in the plurality of supply lines to control the force exerted by the moving member, wherein, upon the gate being at a closed position, each control signal is configured to adjust the at least one of fluid pressure or fluid flow in the respective supply lines so as to increase the force exerted on the gate.

2. The slit valve apparatus of claim 1, wherein the slit valve apparatus comprises a plurality of slit-valve assemblies.

3. The slit valve apparatus of claim 2, wherein the centralized controller is in communication with the plurality of slit-valve assemblies.

4. The slit valve apparatus of claim 1, wherein the at least one of fluid pressure or fluid flow to the pneumatic actuator is to control the force exerted by the moving member within the pneumatic actuator on the gate.

5. The slit valve apparatus of claim 4, wherein, upon the gate approaching the open position or the closed position, each control signal is configured to adjust the at least one of fluid pressure or fluid flow in the respective supply lines so as to decelerate the gate and pause the gate upon reaching the open position or the closed position.

6. The slit valve apparatus of claim 4, wherein, upon the gate initiating movement from the open position towards the closed position or from the closed position towards the open position, each control signal is configured to adjust the at least one of fluid pressure or fluid flow in the respective supply lines so as to accelerate the gate.

7. The slit valve apparatus of claim 1, wherein one of:
    a pressure differential between a first station proximate to a first side of the gate and a second station proximate to a second side opposite the first side of the gate is less than 300 Torr, and wherein the fluid pressure to the respective supply lines ranges from about 10 psig to about 45 psig; or
    a pressure differential between a first station proximate to a first side of the gate and a second station proximate to a second side opposite the first side of the gate is greater than 300 Torr, and wherein the fluid pressure to the respective supply lines ranges from about 55 psig to about 80 psig.

8. The slit valve apparatus of claim 1, wherein the continuous position sensor is configured to generate a continuous analog output or a continuous digital output indicative of the linear position of the gate throughout its motion from the open position to the closed position and vice versa.

9. The slit valve apparatus of claim 8, wherein the continuous position sensor comprises at least one of a varistor, an inductive sensor, an encoder, a light based system, or a capacitive based system.

10. The slit valve apparatus of claim 1, wherein the proportional pneumatic valve comprises an analog control configured to vary fluid flow between full flow and no flow.

11. The slit valve apparatus of claim 10, wherein the proportional pneumatic valve comprises a poppet valve or a proportional spool valve.

12. A method of controlling a slit valve apparatus, comprising:
    receiving, by a centralized controller, a position trajectory for a gate of the slit valve apparatus;
    receiving, by the centralized controller, a linear position measurement from a continuous position sensor that continuously determines a linear position of the gate;
    receiving, by the centralized controller, at least one of fluid pressure or a fluid flow measurement from each of a plurality of controllers of a proportional pneumatic valve that independently measures at least one of fluid pressure or fluid flow in a respective supply line of a plurality of supply lines coupled to a pneumatic actuator;
    generating, by the centralized controller, control signals based on the position trajectory, the linear position measurement, and the at least one of fluid pressure or fluid flow measurement in each of the respective supply lines;
    transmitting, by the centralized controller, each control signal to respective controllers of the plurality of controllers to adjust the at least one of fluid pressure or fluid flow in the respective supply lines to control a force exerted by a moving member, of the pneumatic actuator, on the gate; and in response to the gate reaching a closed position, causing, by the centralized controller, each control signal to adjust the at least one of fluid pressure or fluid flow in the respective supply lines so as to increase the force exerted on the gate.

13. The method of claim 12, wherein, upon the gate approaching an end position, causing, by the centralized controller, the proportional pneumatic valve and the plurality of controllers to adjust the at least one of fluid pressure or fluid flow in the respective supply lines so as to decelerate the gate and pause the gate upon reaching the end position.

14. The method of claim 13, wherein the end position is an open position or a closed position.

15. The method of claim 12, wherein, upon the gate initiating movement from an open position towards a closed position or from a closed position towards an open position, causing, by the centralized controller, the plurality of controllers of the proportional pneumatic valve to adjust the at least one of fluid pressure or fluid flow in the respective supply lines to the pneumatic actuator so as to accelerate the gate.

16. A method comprising:
operating a servo-control system to exert force on a gate of a slit valve assembly, the operating comprising:
actuating a proportional pneumatic valve to permit fluid to flow through a plurality of supply lines coupled to a pneumatic actuator of the slit valve assembly;
measuring at least one of fluid pressure or fluid flow in the plurality of supply lines;
measuring a linear position of the gate with a continuous position sensor;
in response to the linear position measurement and the at least one of fluid pressure or fluid flow measurement in the plurality of supply lines, controlling the proportional pneumatic valve adjust the at least one of fluid pressure or fluid flow in the plurality of supply lines;
exerting force on the gate by a moving member of the pneumatic actuator via controlling the fluid flowing through the plurality of supply lines; and
in response to the gate reaching a closed position, adjusting the at least one of fluid pressure or fluid flow of the fluid in the respective supply lines so as to increase the force exerted on the gate.

17. The method of claim 16, wherein the slit valve assembly comprises:
the gate, configured to transition between an open position to a closed position;
the pneumatic actuator, comprising a moving member coupled to the gate, the moving member configured to exert the force on the gate;
the proportional pneumatic valve, configured to control the at least one of fluid pressure or fluid flow between a pressurized fluid supply or a vent and the pneumatic actuator, the proportional pneumatic valve comprising a plurality of controllers each configured to independently measure and control least one of fluid pressure or fluid flow in a respective supply line of the plurality of supply lines; and
a continuous position sensor configured to continuously determine the linear position of the gate.

18. The method of claim 16, wherein the operating further comprises:
measuring a position trajectory of the gate; and
using the position trajectory, in addition to the linear position measurement of the gate and the at least one of the fluid pressure or fluid flow measurement in the plurality of supply lines, to control the proportional pneumatic valve to adjust the at least one of fluid pressure or fluid flow in the plurality of supply lines.

19. The method of claim 16, wherein the operating further comprises:
measuring a position trajectory of the gate;
generating control signals based on the position trajectory, the linear position measurement, and the at least one of fluid pressure or fluid flow measurement in the plurality of supply lines; and
transmitting respective control signals to respective controllers of a plurality of controllers of the proportional pneumatic valve to adjust the at least one of fluid pressure or fluid flow in the plurality of supply lines to control the force exerted by the moving member.

20. The method of claim 19, wherein the operating further comprises, upon the gate initiating movement from an open position towards a closed position or from a closed position towards an open position, causing the plurality of controllers of the proportional pneumatic valve to adjust the at least one of fluid pressure or fluid flow in the respective supply lines to the pneumatic actuator so as to one of accelerate the gate or decelerate the gate, respectively.

* * * * *